(12) United States Patent
Chang et al.

(10) Patent No.: US 12,382,837 B2
(45) Date of Patent: Aug. 5, 2025

(54) METHOD FOR CHARACTERIZING MAGNETIC DEVICE

(71) Applicant: TAIWAN SEMICONDUCTOR MANUFACTURING COMPANY LTD., Hsinchu (TW)

(72) Inventors: I Cheng Chang, Hsinchu (TW); Tsann Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 552 days.

(21) Appl. No.: 17/377,849

(22) Filed: Jul. 16, 2021

(65) Prior Publication Data

US 2023/0019001 A1   Jan. 19, 2023

(51) Int. Cl.
  *H10N 50/01*   (2023.01)
  *H10B 61/00*   (2023.01)
  *H10N 50/10*   (2023.01)
  *H10N 50/80*   (2023.01)

(52) U.S. Cl.
  CPC .............. *H10N 50/01* (2023.02); *H10B 61/00* (2023.02); *H10N 50/10* (2023.02); *H10N 50/80* (2023.02)

(58) Field of Classification Search
  CPC ........ H10N 50/01; H10N 50/10; H10N 50/80; H10B 61/00; G01R 33/098; G01R 33/14
  See application file for complete search history.

(56) References Cited

U.S. PATENT DOCUMENTS

| | | | |
|---|---|---|---|
| 2005/0174702 A1* | 8/2005 | Gill | H01F 10/3263 |
| 2008/0042779 A1* | 2/2008 | Carey | G11B 5/3166 333/167 |
| 2017/0179373 A1* | 6/2017 | Swerts | H10N 50/10 |
| 2018/0090674 A1* | 3/2018 | Wang | H10N 50/80 |

* cited by examiner

*Primary Examiner* — Eva Y Montalvo
*Assistant Examiner* — Zhijun Xu
(74) *Attorney, Agent, or Firm* — WPAT LAW; Anthony King

(57) ABSTRACT

The present disclosure provides a method for characterizing magnetic properties of a target layer, including providing a first sample having a first structure, providing a second sample having a target layer over the first structure, obtaining a first magnetic property of the first sample, obtaining a second magnetic property of the second sample, and deriving a third magnetic property of the target layer according to the first magnetic property and the second magnetic property.

20 Claims, 15 Drawing Sheets

METHOD FOR CHARACTERIZING MAGNETIC DEVICE

BACKGROUND

Nonvolatile magnetic devices use the polarity of its magnetization to represent stored data, and are beneficial in that they retain stored data in the absence of electricity. One of these nonvolatile magnetic devices, a magnetic random access memory (MRAM) includes a plurality of MRAM cells in an array. Each MRAM cell typically includes a magnetic tunnel junction (MTJ) element which represents one bit of data.

The MTJ element includes three ferromagnetic films, acting as a hard-bias layer and a reference layer lying under a tunnel barrier layer, and acting as a free layer lying above the tunnel barrier layer. When performing a write operation, magnetizations of both the hard-bias layer and the reference layer must remain intact, while the magnetization of the free layer is free to switch to two opposite directions. When performing a read operation, low resistance ($R_P$) is detected and coded as "0" if the magnetization of the free layer is parallel to that of the reference layer, and high resistance ($R_{AP}$) is detected and coded as "1" if the magnetization of the free layer is antiparallel to that of the reference layer. A tunnel magnetoresistance (TMR) coefficient, defined as $(R_{AP} - R_P)/R_P = \Delta R_T/R_P$, should be as high as possible to ensure a wide read window.

Along with the MRAM development, in addition to characterizing its electrical properties in film and device levels before and after its fabrication, respectively, it is more and more important to characterize magnetic properties of the three ferromagnetic films independently and accurately in a film level before its fabrication.

By virtue of having a method of optimizations among several electrical and magnetic parameters before the MRAM fabrication, one may define an MTJ element meeting design specification, and implement it into the MRAM fabrication to conduct the MRAM development effectively.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
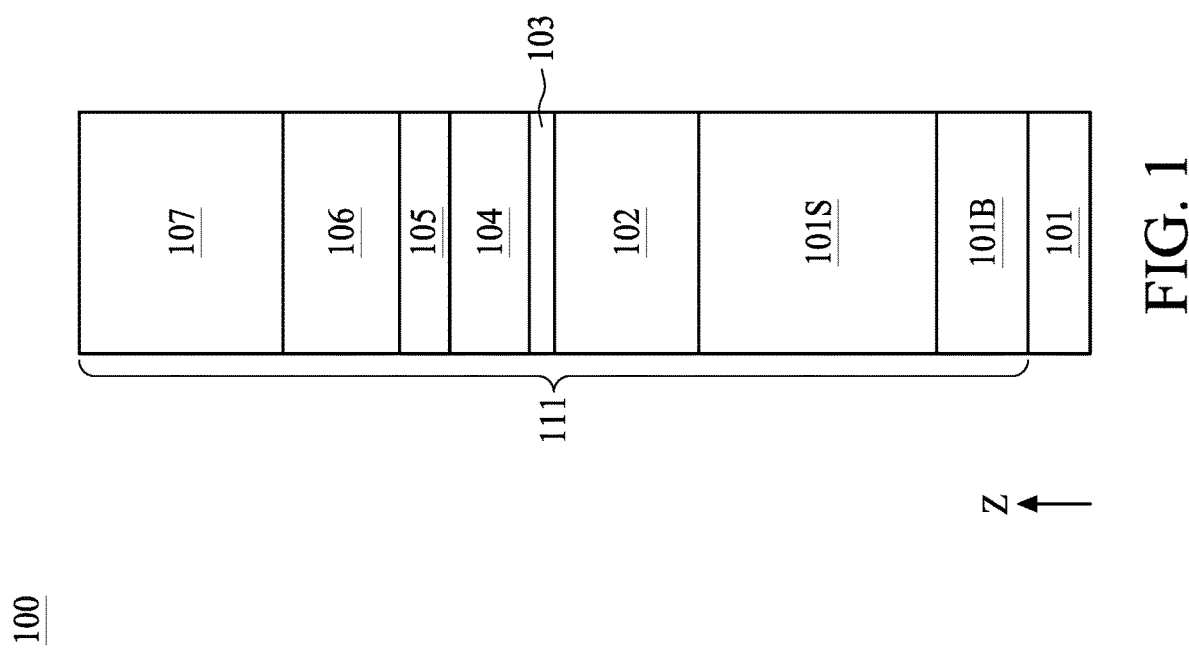
FIG. 1 shows a schematic drawing illustrating a cross sectional view of a MTJ structure, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A magnetic tunnel junction (MTJ) element having a perpendicular magnetic anisotropy (PMA) can be utilized in a magnetic random access memory (MRAM) cell. The MTJ element typically includes two ferromagnetic films, e.g., a hard-bias layer and a reference layer, under a tunnel barrier layer, and one ferromagnetic, e.g., a free layer, over the tunnel barrier layer. The three ferromagnetic films play crucial roles in ensuring the functionality of the MTJ element, and thus require a method of characterizing them independently and accurately in a film level before implementing them into the MRAM cell. In order to conduct this method, an MTJ stack is deposited on a SiO$_2$-coated Si wafer of 300 mm in diameter, and annealed for 5 hours at 400° C. to mimic combination of all heat treatments used in the MRAM fabrication. The wafer is cut into smaller pieces, such as 8 mm×8 mm squares, to form testing samples for operations with a vibrating sample magnetometer (VSM) to characterize magnetic properties of the three ferromagnetic films independently and precisely.

Referring to FIG. 1, FIG. 1 shows a schematic drawing illustrating a cross sectional view of a typical magnetic tunneling junction (MTJ) structure 100, according to some embodiments of the present disclosure. The MTJ structure 100 may include a substrate 101 and an MTJ stack 111 over the substrate 101. The MTJ stack 111 includes a buffer layer 101B over the substrate 101, a seed layer 101S over the buffer layer 101B, a hard-bias layer 102 over the seed layer 101S, an antiparallel-coupling layer 103 over the hard-bias layer 102, a reference layer 104 over the antiparallel-coupling layer 103, a tunnel barrier layer 105 over the reference layer 104, a free layer 106 over the tunnel barrier layer 105, and a cap layer 107 over the free layer 106. In some embodiments, magnetization directions of the free layer 106, the reference layer 104, and the hard-bias layer 102 are along a vertical direction (shown as the Z-direction in FIG. 1) with respect to the substrate 101. The materials utilized in the MTJ structure 100 can serve for the purpose of evaluating the properties thereof prior to actual device fabrication.

In some embodiments, in the case of the free layer 106 having a thickness sufficiently thin, for example, in a range of from about 0.8 nanometer (nm) to about 1.2 nanometer (nm), the free layer 106 may exhibit a magnetization oriented along the vertical direction (i.e. the Z-direction shown in FIG. 1), thus exhibiting a perpendicular magnetic anisotropy (PMA). A free layer thinner or thicker than the thickness range provided above may exhibit an in-plane anisotropy.

The reference layer 104 and the hard-bias layer 102 are separated by the antiparallel-coupling layer 103 and substantially coupled in two antiparallel orientations. The hard-bias layer 102 exhibits an intrinsic PMA, and hard-biases the reference layer 104 to facilitate it to exhibit an extrinsic PMA.

The magnetic moment difference between the reference layer 104 and the hard-bias layer 102 induces a stray field in the free layer 106, and thus requires an optimization for a balance among the stray field, an offset field induced by ferromagnetic/ferromagnetic coupling across the tunnel barrier layer 105, and a demagnetizing field induce at edges of the MTJ element after the fabrication, in order to perform symmetrical write operations.

By operating the VSM, three hysteresis loops can be obtained. The first is a major easy-axis hysteresis loop attained in magnetic fields perpendicular to film surfaces (i.e., in the Z-direction) in a range of from −15,000 to 15,000 Oe. Six magnetic parameters can be determined from the major easy-axis hysteresis loop: (1) A difference between the magnetic moment of the reference 104 and that of the hard-bias layer 102 ($\Delta m$); (2) the magnetic moment of the free layer 106 ($m_{FL}$); (3) an offset strength ($H_o$); (4) the coercivity of the free layer 106 ($H_{C\_FL}$); (5) a spin-flop strength ($H_{SF}$); (6) an antiparallel-coupling strength ($H_{APC}$). The second is a minor easy-axis hysteresis loop attained in magnetic fields perpendicular to film surfaces (i.e., in the Z-direction) in a range of from −400 to 400 Oe. The first four magnetic parameters (namely, $\Delta m$, $m_{FL}$, $H_o$, $H_{C\_FL}$) as described above can be more precisely determined from the minor easy-axis hysteresis loop. The third is a major hard-axis hysteresis loop attained in magnetic fields parallel to film surfaces (i.e., in a direction perpendicular to the Z-direction) in a range of from −20,000 to 20,000 Oe. A uniaxial anisotropy strength of the free layer 106 ($H_{K\_FL}$) can be determined, and a perpendicular magnetic energy ($J_{PMA} = (m_{FL} \times H_{K\_FL})/2$) can be calculated based on the parameters derived from the major hard-axis hysteresis loop and the minor easy-axis hysteresis loop.

It should be noted that antiparallel coupling in the MTJ stack is so strong that it requires a magnetic field of at least 30,000 Oe to fully saturate magnetizations of the hard-bias layer 102 and the reference layer 104. Therefore, a commercially available VSM with the maximum magnetic field of 20,000 Oe is incapable of precisely determining the magnetic moment of the hard-bias layer 102 ($m_{HBL}$), the magnetic moment of the reference layer 104 ($m_{RL}$), and a saturation strength to fully saturate magnetic moments of the MTJ stack 111 ($H_s$). In spite of this incapability, the method in accordance with the disclosure is capable of precisely determining a much more important magnetic parameter, $\Delta m$, even only from a minor easy-axis hysteresis loop with a maximum field of 400 Oe.

However, the present disclosure is not limited by the method with the VSM. For example, alternating gradient magnetometer (AGM), superconducting quantum interference device magnetometer (SQUID), or the like, can also be utilized for observing collective magnetic behaviors.

Conventionally, the MTJ stack 111 is deposited and annealed on a substrate such as a $SiO_2$-coated Si wafer for both electrical and magnetic characterizations. The substrate inevitable contains some magnetic particles, and thus hysteresis loops obtained from the VSM may contain unwanted magnetic responses originating from the substrate. An artificial flatting method is often used to hide the unwanted magnetic responses, and thus resulting magnetic characterization might be misleading. In the present disclosure, subtraction methods as discussed below are used to eliminate the unwanted magnetic responses to ensure the correctness of the magnetic characterization.

Figure 2:
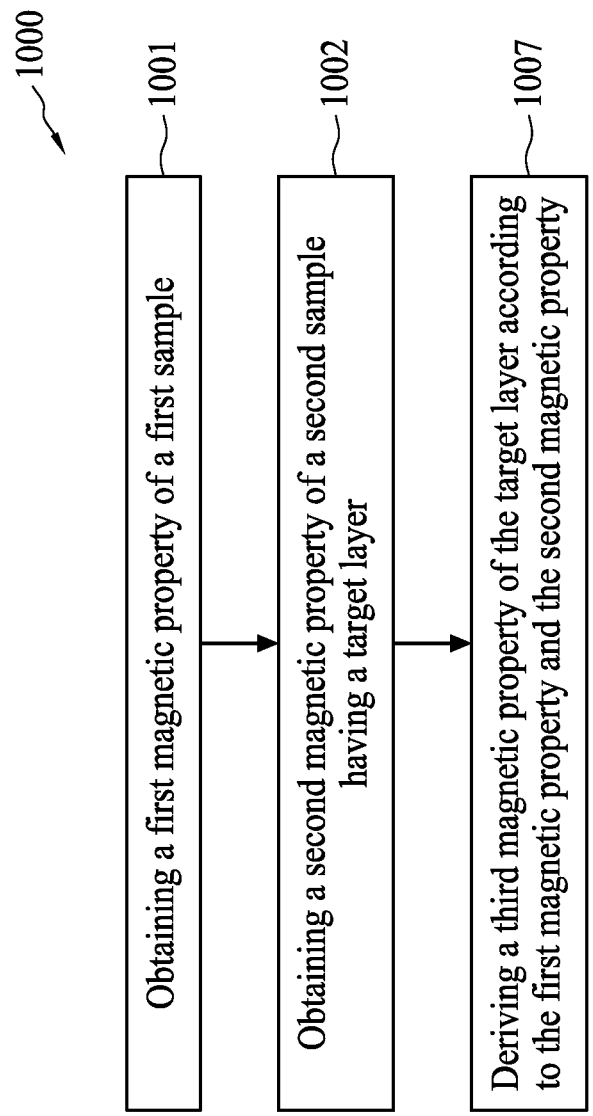
FIG. 2 shows a flow chart representing a method for characterizing a magnetic property of a target layer, in accordance with some embodiments of the present disclosure.

Referring to FIG. 2, FIG. 2 shows a flow chart representing a method 1000 for characterizing a magnetic property of a target layer, in accordance with some embodiments of the present disclosure. The method 1000 for characterizing a magnetic property of a target layer includes obtaining a first magnetic property of a first sample (operation 1001, which can be referred to FIG. 3A or FIG. 6A), obtaining a second magnetic property of the second sample having a target layer (operation 1002, which can be referred to FIG. 3B or FIG. 6B), and deriving a third magnetic property of the target layer according to the first magnetic property and the second magnetic property (operation 1007, which can be referred to FIG. 4A to FIG. 4B, FIG. 5A to FIG. 5B or FIG. 7).

In some embodiments, operation 1001 includes obtaining a first hysteresis loop of a first sample having a first structure, operation 1002 includes obtaining a second hysteresis loop of a second sample having a target layer including a magnetic tunneling junction (MTJ) stack 111 over the first structure, the first hysteresis loop and the second hysteresis loop are obtained in magnetic fields perpendicular to the MTJ stack (hereinafter "easy-axis hysteresis loop"). Operation 1007 includes subtracting the second hysteresis loop from the first hysteresis loop. When the magnetic fields of the testing range from −15,000 Oe to 15,000 Oe is applied, a major easy-axis hysteresis loop calibration is carried out (see FIG. 4A and FIG. 4B). When the magnetic fields of the testing range from −400 Oe to 400 Oe is applied, a minor easy-axis hysteresis loop calibration is carried out (see FIG. 5A and FIG. 5B).

In some embodiments, operation 1001 includes obtaining a first hysteresis loop of a first sample having a first structure, operation 1002 includes obtaining a second hysteresis loop of a second sample having a target layer including a free layer of a magnetic tunneling junction (MTJ) stack over the first structure, the first hysteresis loop and the second hysteresis loop are obtained in magnetic fields parallel to the MTJ stack (hereinafter "hard-axis hysteresis loop"). Operation 1007 includes subtracting the second hysteresis loop from the first hysteresis loop. When the magnetic fields of the testing range from −20,000 Oe to 20,000 Oe is applied, a major hard-axis hysteresis loop calibration is carried out (see FIG. 7).

It should be noted that although the embodiment of performing operation 1001 prior to operation 1002 is used as an example on FIG. 2, alternatively, operation 1002 can also be performed prior to operation 1001 or simultaneously with operation 1001.

The method discussed in the present disclosure aims to improve the accuracy of characterization of magnetic materials by virtue of precluding interfering factors from non-targeted layer, and facilitate the analyzing process based on the result. It should be noted that the hysteresis loops (including major easy-axis hysteresis loop, minor easy-axis hysteresis loop, and major hard-axis hysteresis loop) are referred to a magnetic moment-magnetic field (M-H) measurement that shows the relation between magnetic moment per unit area ($\mu emu/cm^2$) of the testing samples and the magnetic strength (Oersted).

Figure 3A:
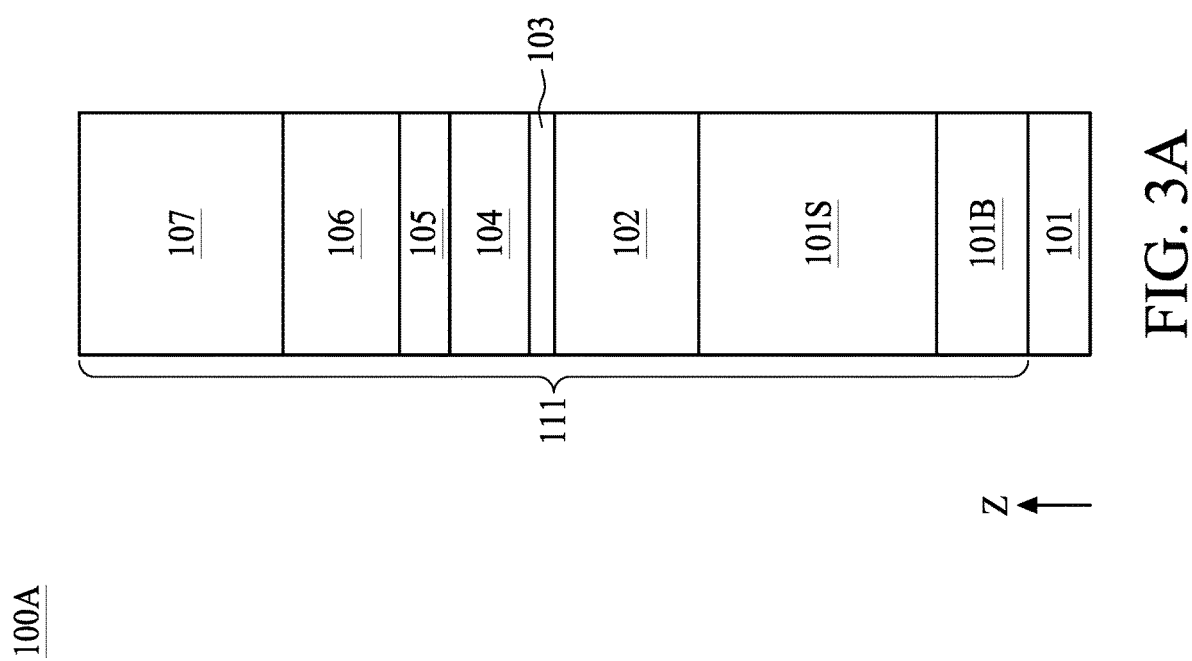
FIG. 3A is a schematic drawing illustrating a cross sectional view of a first testing sample, in accordance with some embodiments of the present disclosure.
Figure 3B:
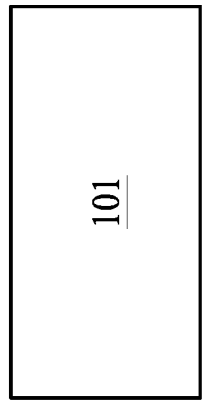
FIG. 3B is a schematic drawing illustrating a cross sectional view of a second testing sample, in accordance with some embodiments of the present disclosure.
Figure 3C:
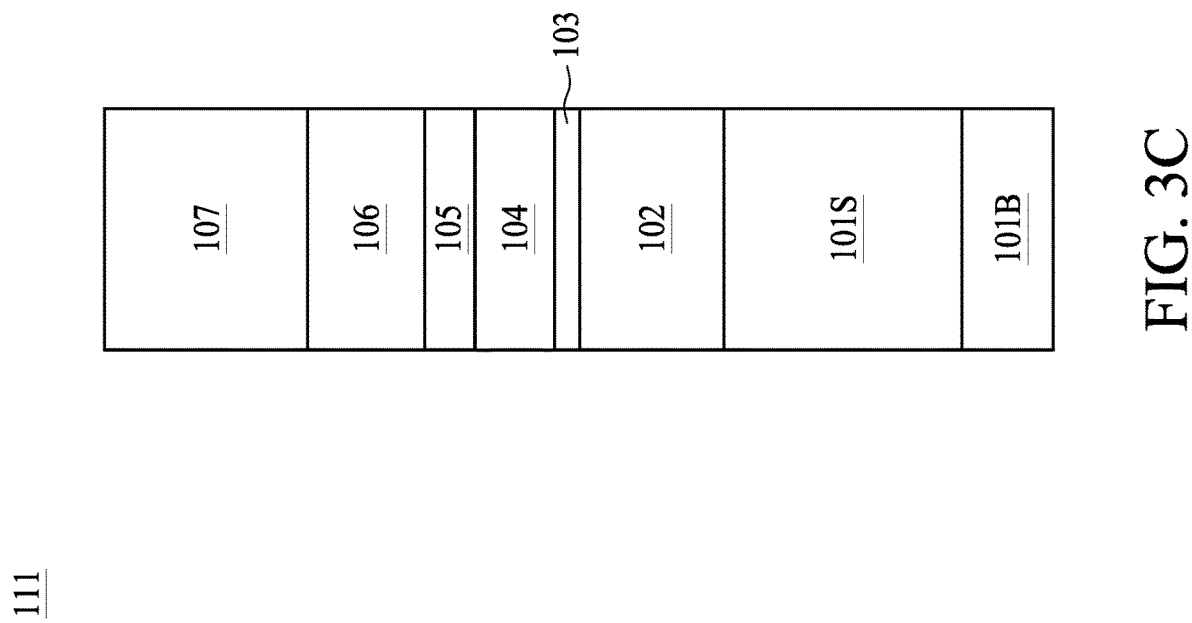
FIG. 3C is a schematic drawing illustrating a cross sectional view of a target layer, in accordance with some embodiments of the present disclosure.

Referring to FIG. 3A, FIG. 3B, and FIG. 3C, FIG. 3A is a schematic drawing illustrating a cross sectional view of a first testing sample 100A, and FIG. 3B is a schematic drawing illustrating a cross sectional view of a second testing sample 100B, FIG. 3C is a schematic drawing illustrating a cross sectional view of a target layer 111, in accordance with some embodiments of the present disclosure. In some embodiments, for the major easy-axis hysteresis measurements, the hysteresis loop of the first testing sample 100A and the hysteresis loop of the second testing sample 100B are separately obtained. The first testing sample 100A includes a substrate 101 and a target layer 111 (e.g., a magnetic tunneling junction (MTJ) stack) annealed together to mimic thermal histories experienced during MTJ device manufacturing. The second testing sample 100B includes only the substrate 101, and is also annealed in the same way as the first testing sample 100A. It should be noted that the shape and size of the first testing sample 100A are identical to that of the second testing sample 100B. Measured data of the major easy-axis hysteresis loop obtained from the first testing sample 100A are subtracted correspondingly by those obtained from the second testing sample 100B. In this way a "background" arising from the substrate 101 is removed, and thus magnetic properties or magnetic parameters (e.g., including, but not limited to, a difference $\Delta m$ between the magnetic moment of a reference layer of the MTJ stack and a hard-bias layer of the MTJ stack, a magnetic moment of a free layer $m_{FL}$ of the MTJ stack, an offset strength $H_{offset}$, a coercivity of the free layer $H_{C\_FL}$, a spin-flop strength $H_{SF}$, and an antiparallel coupling strength $H_{APC}$) of the target layer 111 shown in FIG. 3C can be determined with better precision.

Figure 4A:
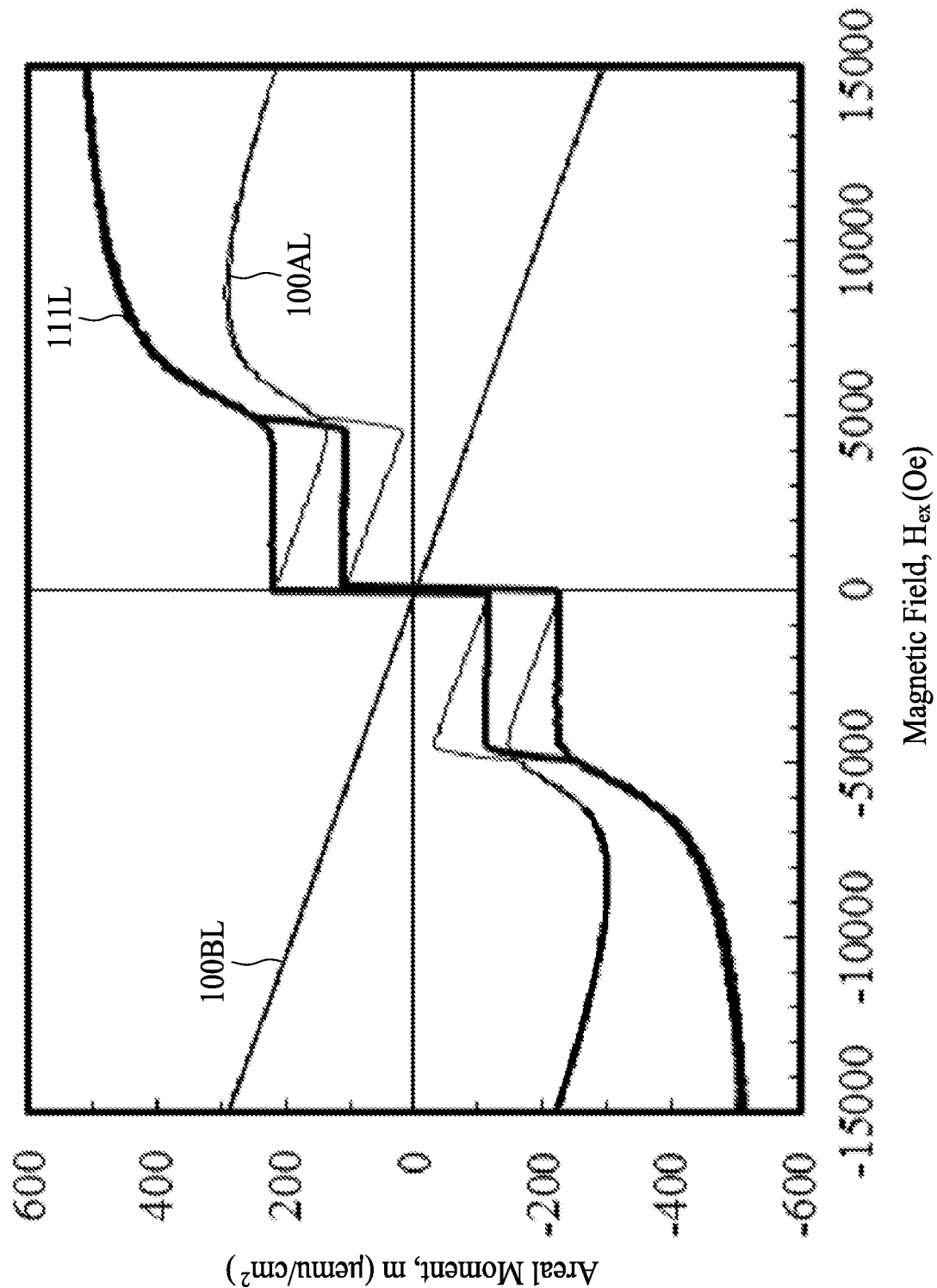
FIG. 4A superimposes the major easy-axis hysteresis loop of the first testing sample, the major easy-axis hysteresis loop of the second testing sample, and the subtracted curve, in accordance with some embodiments of the present disclosure.

FIG. 4A superimposes the major easy-axis hysteresis loop 100AL of the first testing sample 100A, the major easy-axis hysteresis loop 100BL of the second testing sample 100B, and the subtracted curve (i.e., the major easy-axis hysteresis loop 100AL subtracted by the major easy-axis hysteresis loop 100BL) or the equivalents of the major easy-axis hysteresis loop 111L of the target layer 111, in accordance with some embodiments of the present disclosure. The major easy-axis hysteresis loops 100AL and 100BL are measured with an external magnetic field ($H_{ex}$) applied in a direction perpendicular to film interfaces (e.g., perpendicular to the MTJ stack) in a range of from −15,000 Oe to 15,000 Oe. In FIG. 4A, the major easy-axis hysteresis loop 100AL of the first testing sample 100A show substantial titling which originates from the "background" signal of the substrate 101, or the second testing sample 100B. With the subtraction method disclosed herein, the aforesaid "background" can be substantially excluded and the major easy-axis hysteresis loops 111L of the target layer 111 (e.g., the MTJ stack) is obtained. In the present disclosure, subtraction between two hysteresis loops refers to subtracting data points of areal moment of a loop from corresponding data points of areal moment of another loop.

Figure 4B:
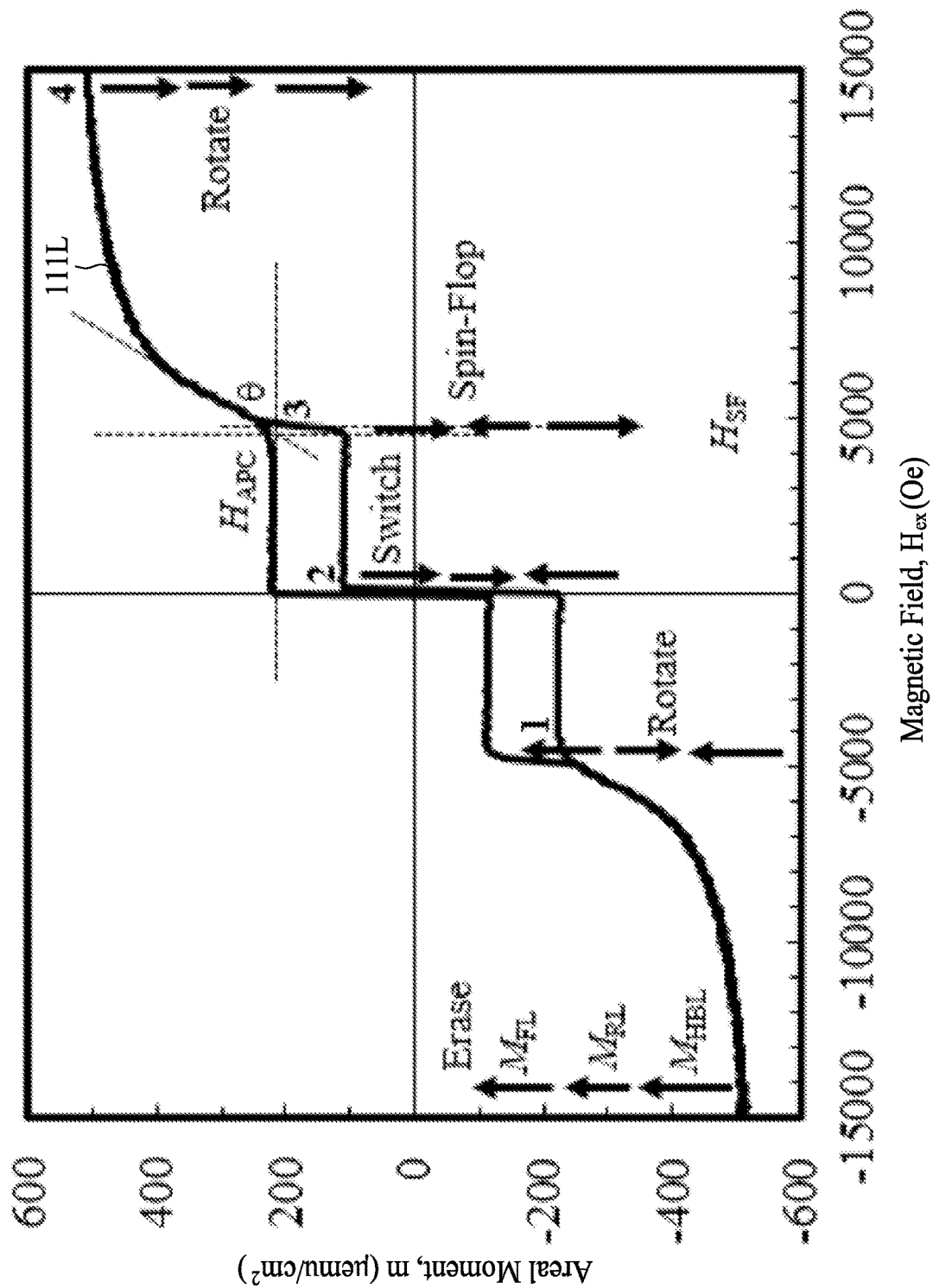
FIG. 4B shows the major easy-axis hysteresis loop of the target layer after the subtraction method, in accordance with some embodiments of the present disclosure.

Referring to FIG. 4B, FIG. 4B shows the major easy-axis hysteresis loops 111L of the target layer 111 after the subtraction method discussed herein and identifies the magnetic behavior of the target layer 111 by annotating various magnetic properties or magnetic parameters on the curve. The magnetic moments of the target layer 111 (e.g., the MTJ stack) is erased in a maximum magnetic field of −20,000 Oe, so that magnetizations of the hard-bias layer 102, the reference layer 104 and the free layer 106 (denoted as $M_{HBL}$, $M_{RL}$ and $M_{FL}$, respectively) are all aligned upwards. As the $H_{ex}$ decreases at point 1, both the $M_{HBL}$ and $M_{FL}$ stay intact in parallel to the $H_{ex}$, while the $M_{RL}$ starts to rotate towards its favorite direction antiparallel to the $M_{HBL}$. As the $H_{ex}$ decreases to below $H_{APC}$, the $M_{RL}$ completes it rotation and achieve an antiparallel-coupling (APC) state between the $M_{HBL}$ and $M_{RL}$. As the $H_{ex}$ becomes downwards and increases to exceed a coercivity of the free layer 106 ($H_{C\_FL}$) at point 2, $M_{FL}$ sharply switches. As the $H_{ex}$ increases to exceed a spin-flop strength ($H_{SF}$) at point 3, both the $M_{HBL}$ and $M_{RL}$ simultaneously spin flop into their another favorite antiparallel state. As the $H_{ex}$ further increases to exceed $H_{APC}$, both the $M_{HBL}$ and $M_{FL}$ stay intact in parallel to the $H_{ex}$, while the $M_{RL}$ starts to rotate towards the $H_{ex}$, and eventually $M_{HBL}$, $M_{RL}$ and $M_{FL}$ are all aligned downwards at point 4.

It should be noted that there are four magnetic behaviors (two rotations, one switch and one spin-flop) in spite that there are only three ferromagnetic layers (i.e., the hard-bias layer 102, the reference layer 104 and the free layer 106). The additional spin-flop occurs only when $H_{APC}$ is larger than an HBL coercivity ($H_{C\_HBL}$). As the $H_{ex}$ increases to exceed $H_{C\_HBL}$ and force the $M_{HBL}$ to rotate, $H_{APC}$ is so large that the $M_{HBL}$ and $M_{RL}$ simultaneously spin flop into their another favorite antiparallel state.

Six magnetic parameters require precise determinations for screening various target layer 111 and selecting few for implementations into the fabrication process of the MTJ stack. Two magnetic parameters, antiparallel-coupling strength ($H_{APC}$) and spin-flop strength ($H_{SF}$), can be identified on the major easy-axis hysteresis loop 111L described in FIG. 4B, while the other four magnetic parameters will be subsequently discussed in FIG. 5B. The first parameter that can be identified on the curve of major easy-axis hysteresis loops is $H_{APC}$, which can be determined by an interception between a horizontal line indicating the $M_{FL}$ saturation and a tilted line indicating the $M_{RL}$ rotation. It originates from antiparallel coupling between the hard-bias layer 102 and the reference layer 104. The $H_{APC}$ is often neglected in the prior art, but is controlled to exceed 6,000 Oe in the present disclosure. After the fabrication process to form the target layer 111 (e.g., the MTJ stack), it is reduced into an extrinsic value exceeding 4,000 Oe due to the processing-induced deterioration of antiparallel coupling. This extrinsic $H_{APC}$ is "the weakest link" among all magnetic strengths.

The second parameter that can be identified on the curve of major easy-axis hysteresis loop is spin-flop strength ($H_{SF}$), which can be determined by an interception between a perpendicular line indicating the spin-flop occurrence and the X-axis. It originates from a competition between a larger $H_{APC}$ and a smaller $H_{C\_HBL}$. The $H_{SF}$ is often neglected in the prior art, but is controlled to exceed 1,000 Oe in the present disclosure. After the fabrication process to form a target layer 111 (e.g., the MTJ stack), it is amplified due to a shape anisotropy into an extrinsic value exceeding 10,000 Oe, which is so high not to cause any concerns on the slip-flop behaviors.

Figure 5A:
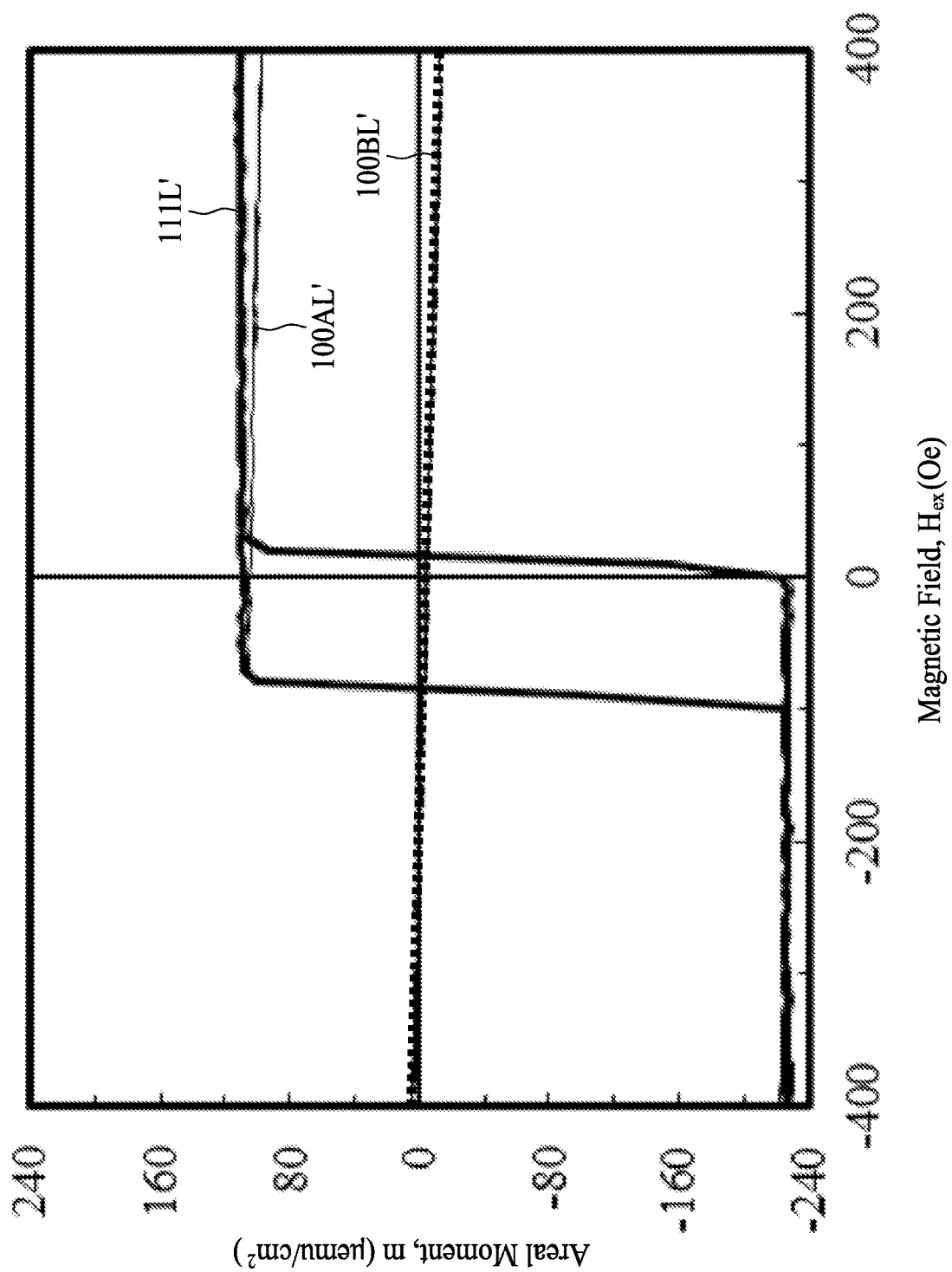
FIG. 5A superimposes the minor easy-axis hysteresis loop of the first testing sample, the minor easy-axis hysteresis loop of the second testing sample, and the subtracted curve, in accordance with some embodiments of the present disclosure.

FIG. 5A superimposes the minor easy-axis hysteresis loop 100AL' of the first testing sample 100A, the minor easy-axis hysteresis loop 100BL' of the second testing sample 100B, and the subtracted curve (i.e., the minor easy-axis hysteresis loop 100AL' subtracted by the minor easy-axis hysteresis loop 100BL') or the equivalents of the minor easy-axis hysteresis loop 111L' of the target layer 111, in accordance with some embodiments of the present disclosure. The minor easy-axis hysteresis loops 100AL' and 100BL' are measured with an external magnetic field ($H_{ex}$) applied in a direction perpendicular to film interfaces (e.g., perpendicular to the MTJ stack) in a range of from −400 Oe to 400 Oe. The measurement of minor easy-axis hysteresis loop can help complement the magnetic parameters identified in the major easy-axis hysteresis loop, as shown in FIG. 4B, and provide more information on the other four magnetic parameters, namely, Δm, $m_{FL}$, $H_{offset}$, and $H_{C\_FL}$. In FIG. 5A, the major easy-axis hysteresis loop 100AL' of the first testing sample 100A show substantial titling which originates from the "background" signal of the substrate 101, or the second testing sample 100B. With the subtraction method disclosed herein, the aforesaid "background" can be substantially excluded and the minor easy-axis hysteresis loops 111L' of the target layer 111 (e.g., the MTJ stack) is obtained. In the present disclosure, subtraction between two hysteresis loops refers to subtracting data points of areal moment from a loop of corresponding data points of areal moment of another loop.

Figure 5B:
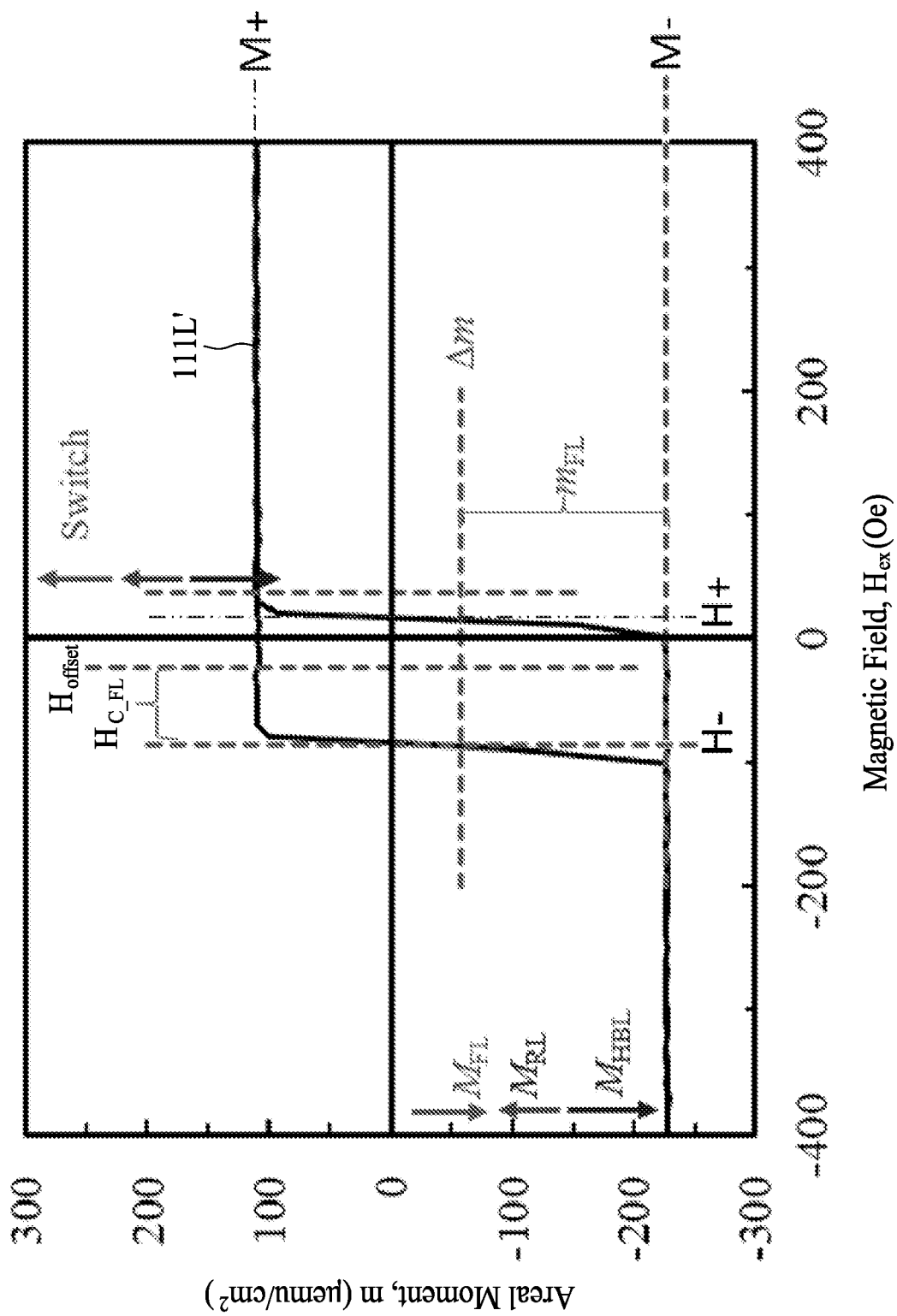
FIG. 5B shows the minor easy-axis hysteresis loops of the target layer after the subtraction method, in accordance with some embodiments of the present disclosure.

Referring to FIG. 5B, FIG. 5B shows the minor easy-axis hysteresis loops 111L' of the target layer 111 after the subtraction method discussed herein and identifies the magnetic behavior of the target layer 111 (e.g., the MTJ stack) by annotating various magnetic properties or magnetic parameters on the curve. As $H_{ex}$ increases downwards and upwards to exceed $H_{C\_FL}−H_o$, and $H_{C\_FL}+H_o$, respectively, $M_{FL}$ sharply switches, forming an asymmetrical hysteresis loop shifted by $H_{offset}$, while both $M_{HBL}$ and $M_{RL}$ remain intact. In addition, the asymmetrical hysteresis loop is also shifted by Δm (i.e., $m_{RL}−m_{HBL}$), originating from that both $M_{HBL}$ and $M_{RL}$ remain intact and thus exhibits Δm when $H_{ex}$ is smaller than $H_{SF}$ and $H_{APC}$. Therefore, without knowing $m_{RL}$ and $m_{HBL}$, Δm can be determined from the asymmetric minor easy-axis hysteresis loop 111L' of the target layer 111 (e.g., the MTJ stack) only.

In FIG. 5B, four other magnetic parameters previously discussed (namely, Δm, $m_{FL}$, $H_{offset}$, and $H_{C\_FL}$) can be identified more clearly with suitable scales of magnetic fields otherwise difficult to be identified under major easy-axis hysteresis loops. The first magnetic parameter is Δm, which can be determined by ((m+)+(m−))/2, where m+ and m− are intersections of the minor easy-axis hysteresis loop of the target layer 111 and the Y-axis. The second magnetic parameter is $m_{FL}$, which can be determined by ((m+)−(m−))/2. Instead of the physical thickness, it is the magnetic moment that drives the performance of the target layer 111 (e.g., the MTJ stack). Both the Δm and $m_{FL}$ are deemed to be more important than $m_{HBL}$ and $m_{HL}$ (which can still be determined from samples containing the hard-bias layer 102 and the reference layer 104, respectively) since these two magnetic parameters are especially needed to be implemented into micromagnetic modeling for the design of the target layer 111 (e.g., the MTJ stack) for actual fabrication in later stage.

The first magnetic parameter Δm is often neglected in the prior art, but is controlled within a range of from −30 to −90 μemu/cm² in the present disclosure, in order to induce a stray field into the free layer 106 for counter-balancing other fields. A positive value will lead to non-functionality, and a nearly zero values will lead to difficulties in saturating magnetizations of the target layer 111 (e.g., the MTJ stack). The second magnetic parameter $m_{FL}$ is often neglected in the prior art, but is controlled within a range of from 140 to 200

μemu/cm² in the present disclosure, in order to exhibit a PMA strong enough for a proper operation of the target layer 111 (e.g., the MTJ stack).

The third magnetic parameter is $H_{offset}$, which can be determined by $((H+)+(H-))/2$, where H+ and H− are intersections of the minor easy-axis hysteresis loop and the X-axis. It originates from ferromagnetic/ferromagnetic coupling between the reference layer 104 and the free layer 106 and across the tunnel barrier layer 105. It is often neglected in the prior art, but is controlled within a range of from 0 to −20 Oe in the present disclosure. After the fabrication process to form the target layer 111 (e.g., the MTJ stack), it is amplified due to a shape anisotropy into an extrinsic value within a range from 0 to −200 Oe, which is needed to counterbalance stray fields stemming from the Δm and demagnetizing fields existing at edges of the target layer 111 (e.g., the MTJ stack) to operate symmetrically.

The fourth magnetic parameter is $H_{C\_FL}$, which can be determined by $((H+)-(H-))/2$. It originates from the strength of magnetic domains existing in the free layer 106, which the external magnetic field must exceed to switch the magnetization of the free layer 106 into an opposite direction. It is often neglected in the prior art, but is controlled within a range of from 50 to 200 Oe in the present disclosure. After the fabrication process to form the target layer 111 (e.g., the MTJ stack), it is amplified due to a shape anisotropy into an extrinsic value within a range from 500 to 2,000 Oe, which would combine with a perpendicular magnetic anisotropy (PMA) to contribute to a switching strength, $H_s$ which the external magnetic field must exceed to switch the magnetization of the free layer 106 into an opposite direction in the target layer 111 (e.g., the MTJ stack).

Figure 6A:
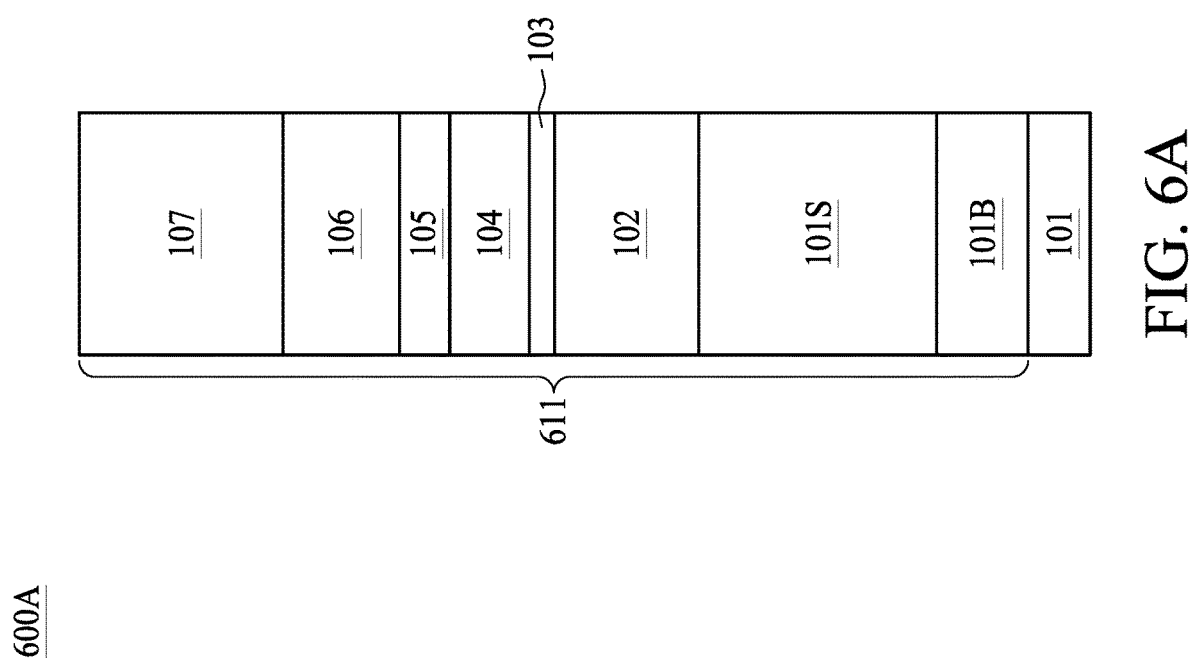
FIG. 6A is a schematic drawing illustrating a cross sectional view of a first testing sample, in accordance with some embodiments of the present disclosure.
Figure 6B:
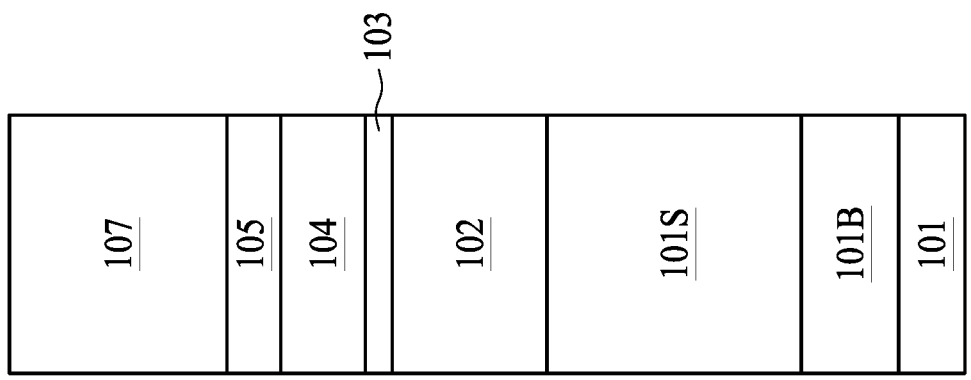
FIG. 6B is a schematic drawing illustrating a cross sectional view of a second testing sample, in accordance with some embodiments of the present disclosure.
Figure 6C:
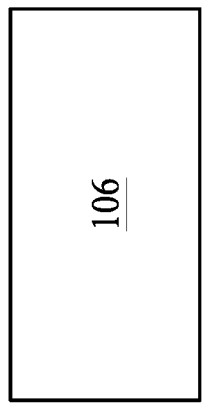
FIG. 6C is a schematic drawing illustrating a cross sectional view of a target layer, in accordance with some embodiments of the present disclosure.

Referring to FIG. 6A, FIG. 6B and FIG. 6C, FIG. 6A is a schematic drawing illustrating a cross sectional view of a first testing sample 600A, and FIG. 6B is a schematic drawing illustrating a cross sectional view of a second testing sample 600B, FIG. 6C is a schematic drawing illustrating a cross sectional view of a target layer 600C, in accordance with some embodiments of the present disclosure. In some embodiments, for the hard-axis hysteresis loop measurements, the hysteresis loop of the first testing sample 600A and the hysteresis loop of the second testing sample 600B are separately obtained. The first testing sample 600A includes a substrate 101 and an MTJ stack 611 (which can be substantially identical to the MTJ stack 111 of the first testing sample 100A) annealed together to mimic thermal histories experienced during MTJ device manufacturing. The second testing sample 600B is substantially identical to the first testing sample 600A but excluding the free layer 106. The second testing sample 600B is also annealed in the same way as the first testing sample 600A. It should be noted that the shape and size of the first testing sample 600A can be identical to that of the second testing sample 600B. Measured data of the hard-axis hysteresis loop from the first testing sample 600A are subtracted correspondingly by those from the second testing sample 600B. Unlike the first testing sample 100A and second testing sample 100B described previously, since both samples 600A and 600B have common backgrounds, and the common backgrounds can be canceled out after the subtraction, a sample containing only an annealed substrate 101 (i.e., the second testing sample 100B) is not required in the embodiment of hard-axis hysteresis loop measurement. Magnetic properties or magnetic parameters (e.g., including, but not limited to uniaxial anisotropy strengths of the free layer 106 ($H_{K\_FL}$) of the target layer 600C shown in FIG. 6C) can thereby be determined with better precision. In some embodiments, the cap layer 107 in the samples 600A and 600B helps alleviating undesired moment loss, which could be induced by annealing in some cases.

Figure 7:
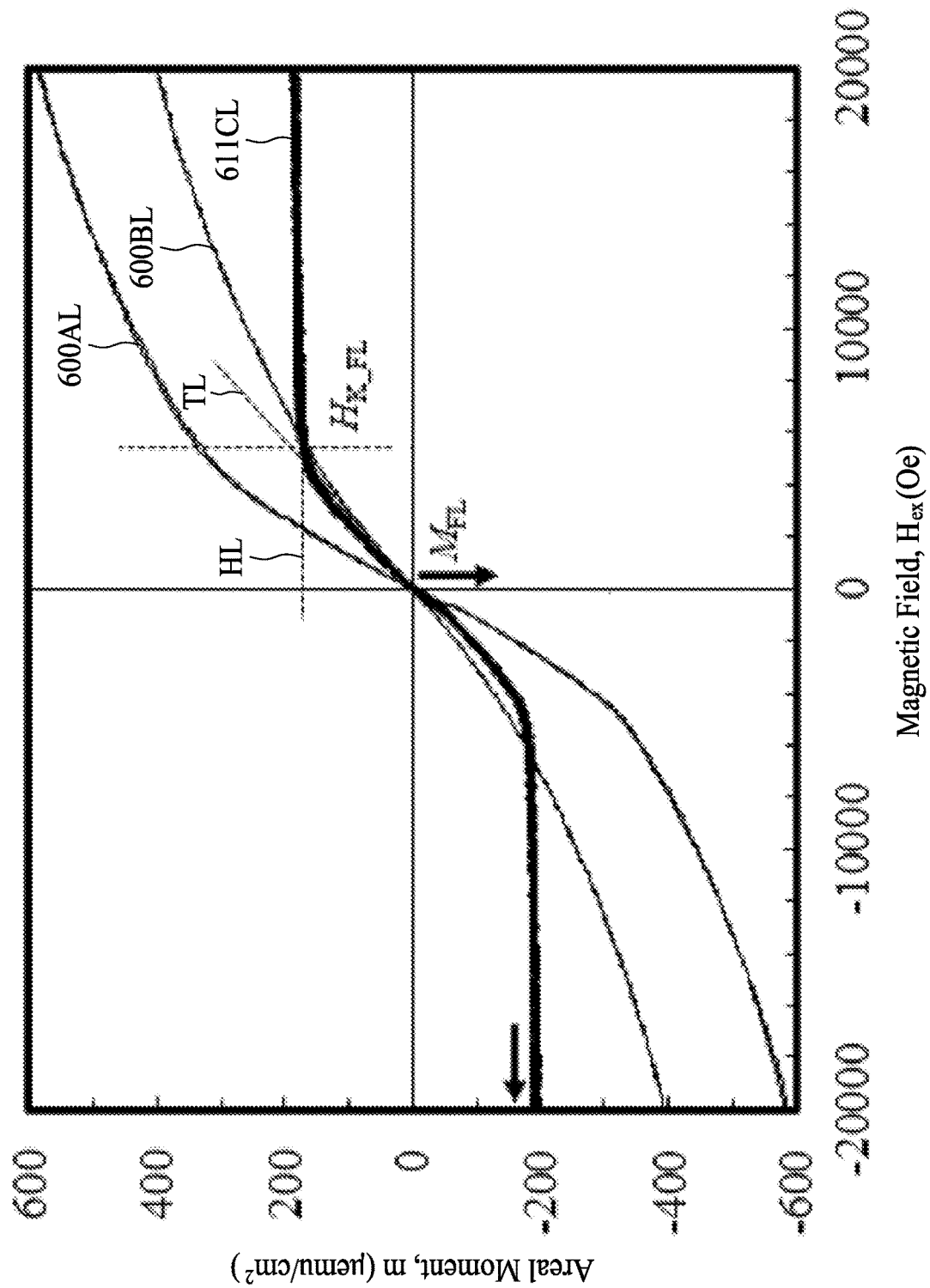
FIG. 7 superimposes the hard-axis hysteresis loop of the first testing sample, the hard-axis hysteresis loop of the second testing sample, and the subtracted curve, in accordance with some embodiments of the present disclosure.

FIG. 7 superimposes the hard-axis hysteresis loop 600AL of the first testing sample 600A, the hard-axis hysteresis loop 600BL of the second testing sample 600B, and the subtracted curve (i.e., the hard-axis hysteresis loop 600AL subtracted by the hard-axis hysteresis loop 600BL) or the equivalents of the major hard-axis hysteresis loop 600CL of the target layer 600C, in accordance with some embodiments of the present disclosure. The major hard-axis hysteresis loops 600AL and 600BL are measured with an external magnetic field ($H_{ex}$) applied in a direction parallel to film interfaces (e.g., parallel to the MTJ stack) in a range of from −20,000 to 20,000 Oe. The measurement of hard-axis hysteresis loop can help complement the magnetic parameters identified in the major and minor easy-axis hysteresis loop, as shown in FIG. 4B and FIG. 5B, and provide more information on other magnetic parameters, for example, uniaxial anisotropy strengths of the free layer 106 ($H_{K\_FL}$) and the perpendicular magnetic energy ($J_{PMA}$) derived from $H_{K\_FL}$ and $M_{FL}$.

As shown in FIG. 7, as $H_{ex}$ increases, $M_{HBL}$, $M_{RL}$ and $M_{FL}$ independently rotate towards film interfaces. If $H_{ex}$ increases to exceed uniaxial anisotropy strengths of the hard-bias-layer 102, the reference layer 104 and the free layer 106 ($H_{K\_HBL}$, $H_{K\_RL}$, and $H_{K\_FL}$, respectively), $M_{HBL}$, $M_{RL}$ and $M_{FL}$ reach full saturations, respectively. However, antiparallel coupling is so strong that it is difficult to fully saturating $M_{HBL}$ and $M_{RL}$ without a magnetic field exceeding 40,000 Oe. In spite of these difficulties, with the subtraction method used for hard-axis measurements, contributions from the substrate 101, the hard-bias layer 102 and the reference layer 104 are correspondingly eliminated, and thus a hard-axis hysteresis loop of the free layer 106 appears. A uniaxial anisotropy strength of the free layer 106 ($H_{K\_FL}$), which can be precisely determined from an interception between a tilted line TL and a saturation horizontal line HL. With determined $M_{FL}$ and $H_{K\_FL}$, a perpendicular magnetic energy ($J_{PMA}$) can be determined according to the formula $J_{PMA}=(M_{FL}\times H_{K\_FL})/2$. The $J_{PMA}$ requires design optimizations between fast magnetization switching (the smaller, the faster) and long data retention (the larger, the longer) for different applications.

By utilizing different types of hysteresis loops including, but not limited to, major easy-axis hysteresis loop (FIG. 4A to FIG. 4B), minor easy-axis hysteresis loop (FIG. 5A to FIG. 5B), and hard-axis hysteresis loop (FIG. 7), various magnetic parameters crucial to MTJ device performance can be obtained prior to actual MTJ device processing. By virtue of applying the subtraction methods discussed in FIG. 3A to FIG. 7b, the magnetic parameters of various target layer set forth can be determined. The magnetic parameters of the target layer can be tuned by adjusting the manufacturing conditions when preparing the first testing sample and the second testing sample.

Figure 8:
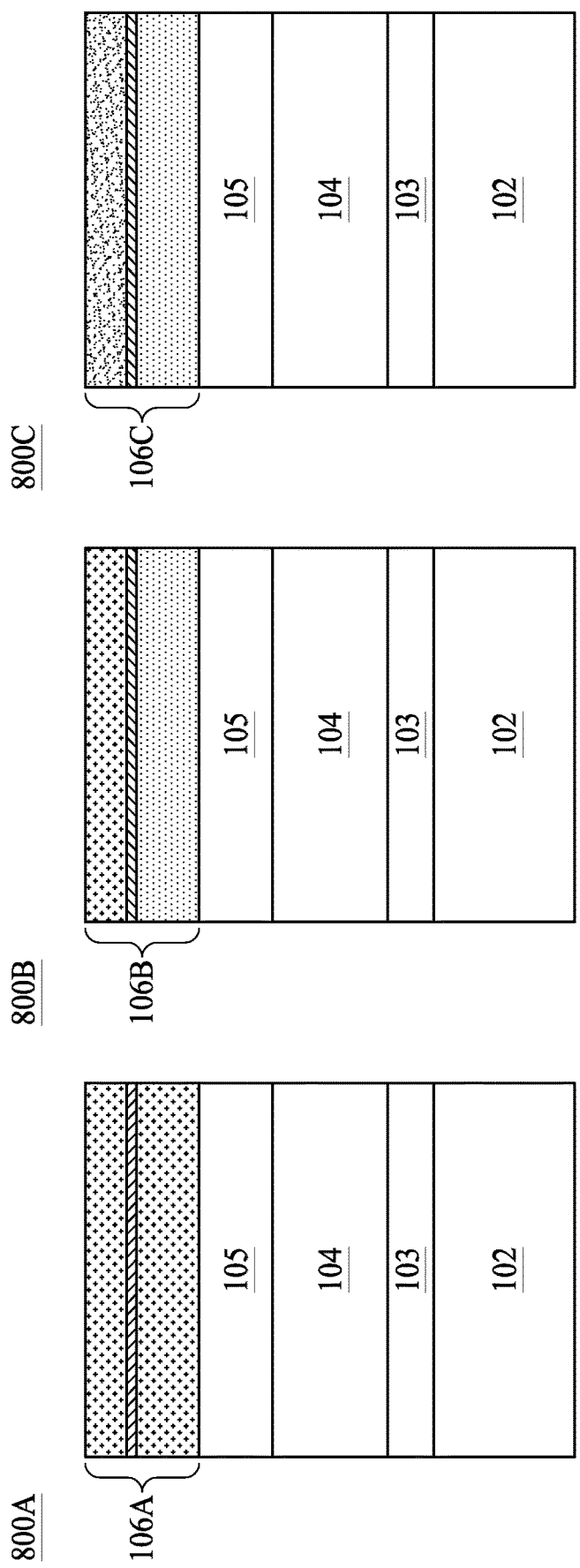
FIG. 8 is a schematic drawing illustrating MTJ structures, in accordance with some embodiments of the present disclosure.
Figure 9:
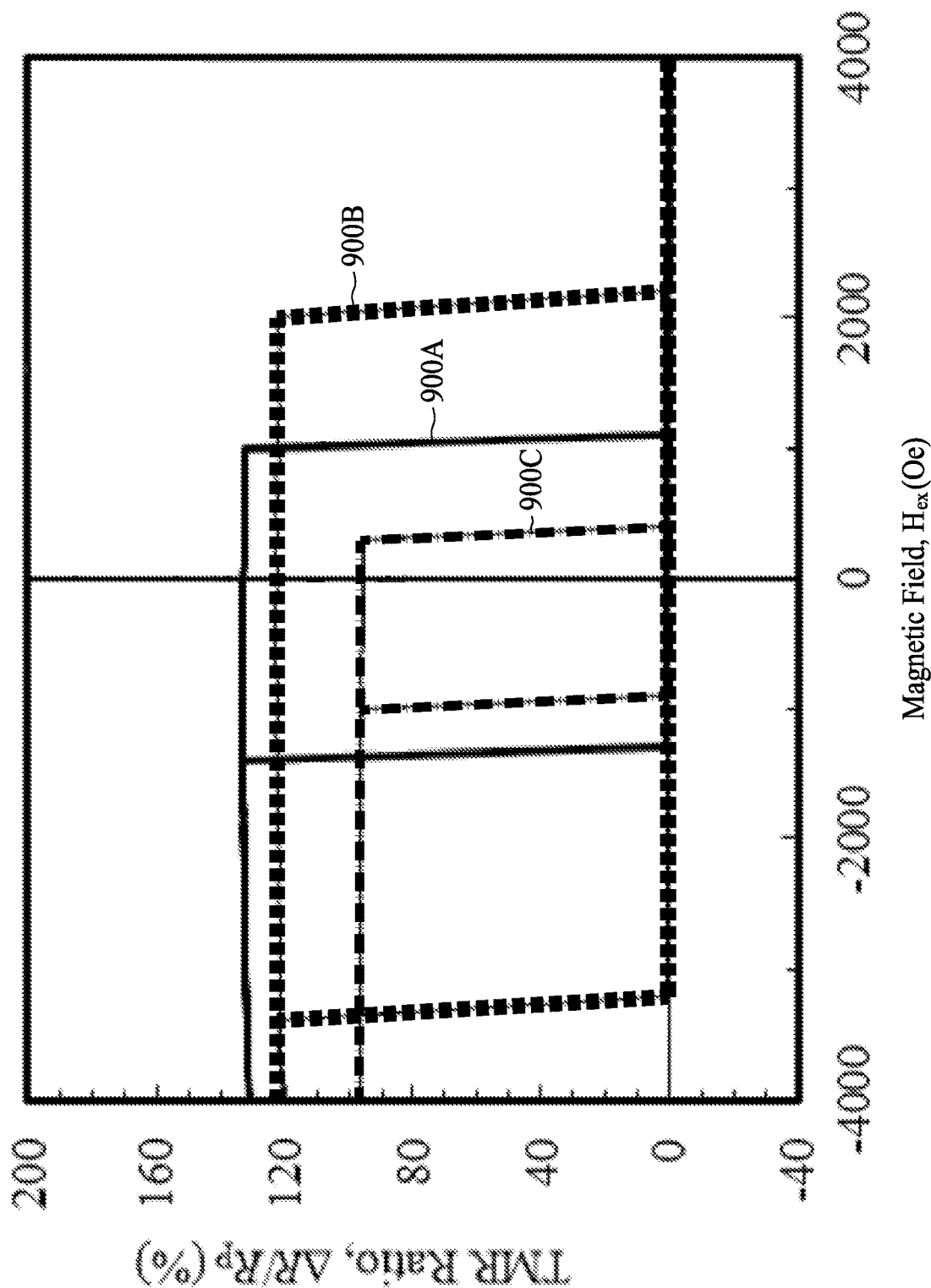
FIG. 9 shows electrical responses of MTJ structures shown in FIG. 8 fabricated for different applications, in accordance with some embodiments of the present disclosure.

Referring to FIG. 8 and FIG. 9, FIG. 8 is a schematic drawing illustrating MTJ structures 800A, 800B, 800C, and FIG. 9 shows electrical responses of three different MTJ structures 800A, 800B, 800C fabricated for different device applications, in accordance with some embodiments of the present disclosure. Different MTJ structures 800A, 800B, 800C fabricated for different device applications may include different designs of MTJ stacks, for example, different designs of the free layer 106A, 106B, 106C. Different MTJ structures 800A, 800B, 800C can be manufactured according to the result of the aforesaid hysteresis loop measurement and subtraction method on the corresponding testing samples. Each of the MTJ structures 800A, 800B, 800C can be tested to obtain electrical responses in a way of tunnel magnetoresistance (TMR) ratio to show different tailored properties of the MTJ devices. TMR ratio is defined as $(R_{AP}-R_P)/R_P$ or $\Delta R/R_P$, where $R_{AP}$ and $R_P$ are resistances in antiparallel and parallel magnetization at zero-magnetic field, respectively.

For example, as shown in FIG. 9, curve 900A corresponds to the MTJ structure 800A with a first design to maximize the TMR coefficient to 133%, thereby achieving a wide read window and ensuring a low bit error rate. Curve 900B corresponds to the MTJ structure 800B with a second design to maximize the switching strength ($H_s$ of 3,400 Oe), thereby achieving long data retention. Curve 900C corresponds to the MTJ structure 800C with a third design to minimize switching strength ($H_s$ of 400 Oe), thereby achieving fast switching.

Some embodiments of the present disclosure provide a method for characterizing a magnetic property of a target layer, including providing a first sample having a first structure, providing a second sample having a target layer over the first structure, obtaining a first magnetic property of the first sample, obtaining a second magnetic property of the second sample, and deriving a third magnetic property of the target layer according to the first magnetic property and the second magnetic property.

Some embodiments of the present disclosure provide a method for characterizing a magnetic property of a target layer, including providing a first sample having a first structure, providing a second sample having a target layer over the first structure, wherein the target layer comprises a magnetic tunneling junction (MTJ) stack, and obtaining a magnetic parameter of the MTJ stack, including obtaining a first hysteresis loop of the first sample in magnetic fields perpendicular to the MTJ stack, obtaining a second hysteresis loop of the second sample in the magnetic fields, and subtracting the second hysteresis loop from the first hysteresis loop.

Some embodiments of the present disclosure provide a method for characterizing a magnetic property of a target layer, including providing a first sample having a first structure, providing a second sample having a target layer over the first structure, wherein the target layer includes a free layer of a magnetic tunnel junction (MTJ) stack, obtaining a magnetic parameter of the free layer, including obtaining a first hysteresis loop of the first sample in magnetic fields parallel to the MTJ stack, obtaining a second hysteresis loop of the second sample in the magnetic fields, and subtracting the second hysteresis loop from the first hysteresis loop.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for characterizing a magnetic property of a target layer, comprising:
    providing a first sample having a first structure;
    providing a second sample having a target layer over the first structure;
    obtaining a first magnetic property of the first sample;
    obtaining a second magnetic property of the second sample, wherein at least two magnetic fields perpendicular to a surface of the target layer is applied on the target layer sequentially, and the at least two magnetic fields perpendicular to the surface of the target layer having different ranges of magnetic field strength;
    deriving a third magnetic property of the target layer according to the first magnetic property and the second magnetic property; and
    identifying a spin-flop strength ($H_{SF}$) and an antiparallel-coupling strength ($H_{APC}$) of the target layer, wherein the antiparallel-coupling strength is greater than a coercivity of a hard-bias layer ($H_{C\_HBL}$) in the target layer, wherein a magnetization of the hard-bias layer and a magnetization of a reference layer in the target layer spin flopped simultaneously when a magnetic field strength of the magnetic fields increased to exceed the spin-flop strength.

2. The method of claim 1, wherein deriving the third magnetic property of the target layer comprises subtracting a magnitude of the first magnetic property from a magnitude of the second magnetic property.

3. The method of claim 1, wherein obtaining the second magnetic property comprises applying a magnetic field parallel to the surface of the target layer.

4. The method of claim 1, wherein a magnetic field strength of a first magnetic field of the least two magnetic fields is in a range of from about −15,000 Oersted to about 15,000 Oersted.

5. The method of claim 1, wherein a magnetic field strength of a second magnetic field of the least two magnetic fields is in a range of from about −400 Oersted to about 400 Oersted.

6. The method of claim 1, further comprising:
    controlling the spin-flop strength of the target layer to exceed a threshold of 1,000 Oersted if the spin-flop strength of the target layer is identified as not exceeding the threshold.

7. The method of claim 1, wherein the reference layer and the hard-bias layer are separated by an antiparallel-coupling layer and substantially coupled in two antiparallel orientations.

8. A method for characterizing a magnetic property of a target layer, comprising:
    providing a first sample having a first structure;
    providing a second sample having a target layer over the first structure, wherein the target layer comprises a magnetic tunneling junction (MTJ) stack;

obtaining a magnetic parameter of the MTJ stack, comprising:
  obtaining at least one first hysteresis loop of the first sample in a first magnetic field perpendicular to the MTJ stack and a second magnetic field perpendicular to the MTJ stack sequentially, wherein a magnetic field strength of the first magnetic field is different from a magnetic field strength of the second magnetic field;
  obtaining a second hysteresis loop of the second sample in a third magnetic field; and
  subtracting the second hysteresis loop from the at least one first hysteresis loop; and
identifying a spin-flop strength ($H_{SF}$) and an antiparallel-coupling strength ($H_{APC}$) of the target layer, wherein the antiparallel-coupling strength is greater than a coercivity of a hard-bias layer ($H_{C\_HBL}$) in the target layer,
wherein a magnetization of the hard-bias layer and a magnetization of a reference layer in the target layer spin flopped simultaneously when the magnetic field strength of the first magnetic field or the magnetic field strength of the second magnetic field increased to exceed the spin-flop strength.

9. The method of claim 8, further comprising performing a first annealing operation to the first sample prior to obtaining the at least one first hysteresis loop.

10. The method of claim 9, further comprising performing a second annealing operation to the second sample prior to obtaining the second hysteresis loop.

11. The method of claim 10, wherein a condition of the first annealing operation is identical to a condition of the second annealing operation.

12. The method of claim 8, wherein the at least one first hysteresis loop is measured under the first magnetic field within a range of from about −15,000 Oersted to about 15,000 Oersted.

13. The method of claim 8, wherein the at least one first hysteresis loop is measured under the second magnetic field within a range of from about −400 Oersted to about 400 Oersted.

14. The method of claim 8, further comprising:
  controlling the antiparallel-coupling strength of the target layer to exceed a threshold of 6,000 Oersted.

15. A method for characterizing a magnetic property of a target layer, comprising:
  providing a first sample having a first structure;
  providing a second sample having a target layer over the first structure, wherein the target layer comprises a free layer of a magnetic tunneling junction (MTJ) stack;
  obtaining a magnetic parameter of the free layer, comprising:
    obtaining a first hysteresis loop of the first sample in a magnetic field parallel to the MTJ stack;
    obtaining at least one second hysteresis loop of the second sample in a first magnetic field perpendicular to the MTJ stack and a second magnetic field perpendicular to the MTJ stack sequentially, wherein a magnetic field strength of the first magnetic field is different from a magnetic field strength of the second magnetic field; and
    subtracting the at least one second hysteresis loop from the first hysteresis loop; and
  identifying a spin-flop strength ($H_{SF}$) and an antiparallel-coupling strength ($H_{APC}$) of the target layer, wherein the antiparallel-coupling strength is greater than a coercivity of a hard-bias layer ($H_{C\_HBL}$) in the target layer,
wherein a magnetization of the hard-bias layer and a magnetization of a reference layer in the target layer spin flopped simultaneously when the magnetic field strength of the first magnetic field or the magnetic field strength of the second magnetic field increased to exceed the spin-flop strength.

16. The method of claim 15, further comprising:
  performing a first annealing operation to the first sample prior to obtaining the first hysteresis loop.

17. The method of claim 16, further comprising performing a second annealing operation to the second sample prior to obtaining the at least one second hysteresis loop, wherein a condition of the first annealing operation is identical to a condition of the second annealing operation.

18. The method of claim 15, wherein the first hysteresis loop is measured under the magnetic field within a range of from about −20,000 Oersted to 20,000 Oersted.

19. The method of claim 15, wherein the magnetic parameter comprises uniaxial anisotropy strength of the free layer.

20. The method of claim 15, wherein a range of the magnetic field strength of the first magnetic field is wider than a range of the magnetic field strength of the second magnetic field.

* * * * *